(12) United States Patent
Matsui

(10) Patent No.: US 8,603,904 B2
(45) Date of Patent: Dec. 10, 2013

(54) SEMICONDUCTOR DEVICE AND MANUFACTURING METHOD THEREFOR

(75) Inventor: Takayuki Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 800 days.

(21) Appl. No.: 12/370,660

(22) Filed: Feb. 13, 2009

(65) Prior Publication Data

US 2009/0221137 A1 Sep. 3, 2009

(30) Foreign Application Priority Data

Feb. 29, 2008 (JP) ................................ 2008-050527
Dec. 2, 2008 (JP) ................................ 2008-307403

(51) Int. Cl.
*H01L 21/02* (2006.01)
(52) U.S. Cl.
USPC .......................... 438/585; 438/706; 438/799
(58) Field of Classification Search
None
See application file for complete search history.

(56) References Cited

U.S. PATENT DOCUMENTS

2009/0191714 A1* 7/2009 Lai et al. ...................... 438/706

FOREIGN PATENT DOCUMENTS

| JP | 6-124944 | 5/1994 |
|----|----------|--------|
| JP | 2000-216242 | 8/2000 |
| JP | 2002-43543 | 2/2002 |
| JP | 2007-149812 | 6/2007 |
| JP | 2007-180418 | 7/2007 |
| JP | 2007-201168 | 8/2007 |

OTHER PUBLICATIONS

English translation JP2007149812, Aug. 3, 2011.*
Japanese Patent Office issued a Japanese Office Action dated Feb. 23, 2010, Application No. 2008-307403.

* cited by examiner

*Primary Examiner* — David E Graybill
(74) *Attorney, Agent, or Firm* — Young & Thompson

(57) ABSTRACT

A silicon substrate having a first silicon oxide film formed via thermal oxidation and a second silicon oxide film formed via chemical vapor deposition and the like is subjected to preprocessing prior to selective epitaxial growth, wherein both the first and second silicon oxide films are etched with the same etching rate so as to completely remove the first silicon oxide film. Thus, it is possible to precisely control the sizes of contact holes formed in the silicon substrate, thus preventing contact plugs from short-circuiting with silicon epitaxial layers.

7 Claims, 12 Drawing Sheets

US 8,603,904 B2

SEMICONDUCTOR DEVICE AND MANUFACTURING METHOD THEREFOR

BACKGROUND OF THE INVENTION

1. Field of the Invention

The present invention relates to semiconductor devices and manufacturing methods therefor.

The present application claims priority on Japanese Patent Application Nos. 2008-50527, filed Feb. 29, 2008 and 2008-307403, filed Dec. 2, 2008, the contents of which are incorporated herein by reference.

2. Description of Related Art

Semiconductor devices serving as dynamic random-access memories (DRAM) are constituted of memory cells including transistors and capacitors. Due to current tendencies for developing semiconductor devices having fine structures, it is necessary to further reduce sizes of transistors, which in turn cause problems of short-channel effects of transistors apparently. As sizes of memory cells included in large-scale dynamic random-access memories become smaller, channel lengths of transfer-gate transistors must be reduced correspondingly, wherein as S values of transfer-gate transistors increase, memory cells must be degraded in terms of retentions and write characteristics.

As one countermeasure against short-channel problems of transistors, trench-gate transistors having three-dimensional structures of channels have been developed to improve refresh characteristics of memory cells. Trench-gate transistors are designed to increase channel lengths by effectively using the boundaries of three-dimensional trenches, which are formed on silicon substrates, as channels.

By adopting the above trench-gate structure used in trench-gate transistors (which are each referred to as RCAT, namely "Recess Channel Access Transistor"), it is possible to cope with short-channel problems of transistors and to improve refresh characteristics of memory cells. Due to the trench-gate structure, it is possible to substantially increase channel lengths and to thereby reduce channel doses, whereby it is possible to improve refreshing effects by way of electric-field relaxation of PN junctions in source/drain regions.

Recently, silicon layers are formed above source/drain regions of transistors in accordance with selective epitaxial growth processes and are used as source/drain regions in order to reduce short-channel effects.

In the manufacturing method of semiconductor devices having the trench-gate structure, it is necessary to perform preprocessing so as to remove thermal oxide films and natural oxide films from silicon substrates (used for forming silicon epitaxial layers) during selective epitaxial growth processes.

The present inventor has recognized the following problems, which will be described with reference to FIGS. 8 to 11.

FIG. 8 shows that an embedded insulating film 103 is formed using a high-density plasma chemical vapor deposition (HDP-CVD) film, a CVD film fabricated by CVD, or a spin-on dielectric (SOD) film fabricated by a spinning application, wherein it is embedded in a silicon substrate 101 so as to form an element separation region M1 for defining activate regions K1.

Channels (or trenches) 108 are formed in the silicon substrate 101; then, a thermal oxide film 102 serving as a gate insulating film is formed on the silicon substrate 101 and inside the channels 108; furthermore, gate electrodes 106 composed of wiring materials including polysilicon layers 104 and metal layers 109 are embedded in the channels 108. In addition, silicon nitride films 107 are formed on the gate electrodes 106. In this connection, channels 108a are formed in the embedded insulating film 103 defining the element separation region M1, wherein polysilicon layers 104a and metal layers 109a are formed using the same materials as the polysilicon layers 104 and the metal layers 109 in the gate electrodes 106.

In the selective epitaxial growth process adapted to the surface of the silicon substrate 101, it is necessary to perform preprocessing for removing the thermal oxide film 102 and its natural oxide film in order to expose the surface of the silicon substrate 101. As preprocessing, wet etching is performed using dilute hydrofluoric acid (DHF). Various methods for etching silicon substrates have been disclosed in various documents such as Patent Documents 1-3.

Patent Document 1: Japanese Unexamined Patent Application Publication No. H06-124944
Patent Document 2: Japanese Unexamined Patent Application Publication No. 2000-216242
Patent Document 3: Japanese Unexamined Patent Application Publication No. 2002-43543

When the semiconductor device of FIG. 8 is subjected to wet etching as shown in FIG. 9, the thermal oxide film 102 and its natural oxide film are removed from the surface of the silicon substrate 101 while the embedded insulating film 103 forming the element separation region M1 is simultaneously etched so that a recess 103a is formed on the surface of the embedded insulating film 103. Since the embedded insulating film 103 is composed of an oxide silicon film whose wet etching rate is five to ten times higher than that of the thermal oxide film 102, such as the HDP-CVD film, the CVD film, and the SOD film, the depth of the recess 103a must be larger than the thickness of the thermal oxide film 102.

Due to some trouble occurring in a selective epitaxial growth device such that the silicon substrate 101 is neglected for a long time after preprocessing, another natural oxide film may be unexpectedly formed on the surface of the silicon substrate 101 as shown in FIG. 10. This requires another preprocessing in which the embedded insulating film 103 of the element separation region M1 must be further etched so as to further increase the recess 103a, causing partial exposure of the polysilicon layers 104a from the recess 103a.

Due to the selective epitaxial growth process as shown in FIG. 11, "unwanted" silicon epitaxial layers 105a are additionally formed via the polysilicon layers 104a and are connected to "normal" silicon epitaxial layers 105. This causes short-circuiting between the silicon epitaxial layers 105 and the polysilicon layers 104a formed on the element separation region M1.

SUMMARY

The invention seeks to solve the above problems or to improve upon those problems at least in part.

In one embodiment, a semiconductor device is manufactured in accordance with a manufacturing method in which a silicon substrate having a silicon oxide film is placed in a mixed gas composed of ammonia and hydrofluoric anhydride at a temperature less than 80° C., the mixed gas is replaced with an inert gas, then, the silicon oxide film is sublimated at a temperature higher than 80° C. via dry etching. The silicon oxide film includes a thermal oxide film (entitled "a first silicon oxide film") which is formed on the surface of the silicon substrate via thermal oxidation and an embedded insulating film (entitled "a second silicon oxide film") which is formed in the recess of the silicon substrate via chemical vapor deposition, spinning application, and the like.

In another embodiment, a semiconductor device having trench gate transistors is manufactured in accordance with a manufacturing method in which an embedded insulating film is formed in a silicon substrate so as to form an element separation region while defining at least one active region; a plurality of trenches is formed in the active region; a thermal oxide film is formed inside the trenches of the active region; a metal layer is formed in the trenches of the active region, thus forming gate electrodes; a preprocessing is performed so as to remove the prescribed portion of the thermal oxide film formed on the surface of the active region on both sides of the gate electrodes; then, a selective epitaxial growth process is performed so as to form a silicon epitaxial layer on the silicon substrate. In the preprocessing, both the thermal oxide film and the embedded insulating film are etched with the same etching rate so as to remove the thermal oxide film.

In a further embodiment, a semiconductor device having a plurality of lower electrodes serving as capacitors embedded in an interlayer insulating film composed of silicon oxide formed on a silicon substrate is manufactured in accordance with a manufacturing method in which the silicon substrate which is heated at a temperature lower than 80° C. is placed in a mixed gas composed of ammonia and hydrofluoric anhydride, the mixed gas is replaced with an inert gas, then, the silicon substrate is heated at a temperature higher than 80° C., thus removing the interlayer insulating film via dry etching.

A semiconductor device manufacturing apparatus according to the present invention is constituted of a preprocessing unit for performing a preprocessing in such a way that a silicon substrate which is heated at a temperature lower than 50° C. is placed in a mixed gas composed of ammonia and hydrofluoric anhydride in a chamber, which is temporarily vacuumed and is filled with an inert gas instead of the mixed gas, then, the silicon substrate is heated at a temperature higher than 100° C., and a thin film growth unit for forming thin films via epitaxial growth and chemical vapor deposition. The preprocessing unit is interconnected with the thin film growth unit so that the thin films are smoothly formed on the silicon substrate without exposing the silicon substrate to the atmosphere after the preprocessing.

The present invention has various advantages and effects as follows:

(1) By controlling the etching rate adapted to the embedded insulating film in dry etching of the thermal oxide film, it is possible to prevent wiring materials (i.e. polysilicon layers and metal layers) from being exposed via the contact plugs embedded in the embedded insulating film in the element separation region; thus, it is possible to prevent epitaxial growth from occurring via wiring materials. Even when a relatively long time occurs between the dry etching and the selective epitaxial growth process, it is possible to repeatedly perform the preprocessing.

(2) The embedded insulating film is formed via high-density plasma chemical vapor deposition (HDP-CVD) or spinning application so that the etching rate thereof is lower than the etching rate of the thermal oxide film. This makes it possible to easily and precisely control the etching value of the embedded insulating film.

(3) Since epitaxial growth does not occur via the polysilicon layers formed in the element separation region irrespective of the selective epitaxial growth process, it is possible to reliably prevent the polysilicon layers from being connected to the silicon epitaxial layer. Thus, it is possible to prevent the silicon epitaxial layer from short-circuiting with the wiring materials.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

The following description and the accompanying drawings are used to explain preferred embodiments of the present invention; hence, sizes, thicknesses, and dimensions of constituent elements of semiconductor devices do not precisely match those of actual products.

1. First Embodiment

A first embodiment of the present invention is directed to the manufacturing method of a semiconductor device including an element separation process for forming an STI region and an active region in a silicon substrate, a trench forming process for forming trenches (or channels) in the active region, a gate electrode forming process for forming gate electrodes in trenches, a preprocessing for removing an oxide film via dry etching, and an epitaxial growth process for forming a silicon epitaxial layer via selective epitaxial growth. The details of the processes will be described with reference to FIGS. 1 to 3.

(a) Element Separation Process

Figure 1:
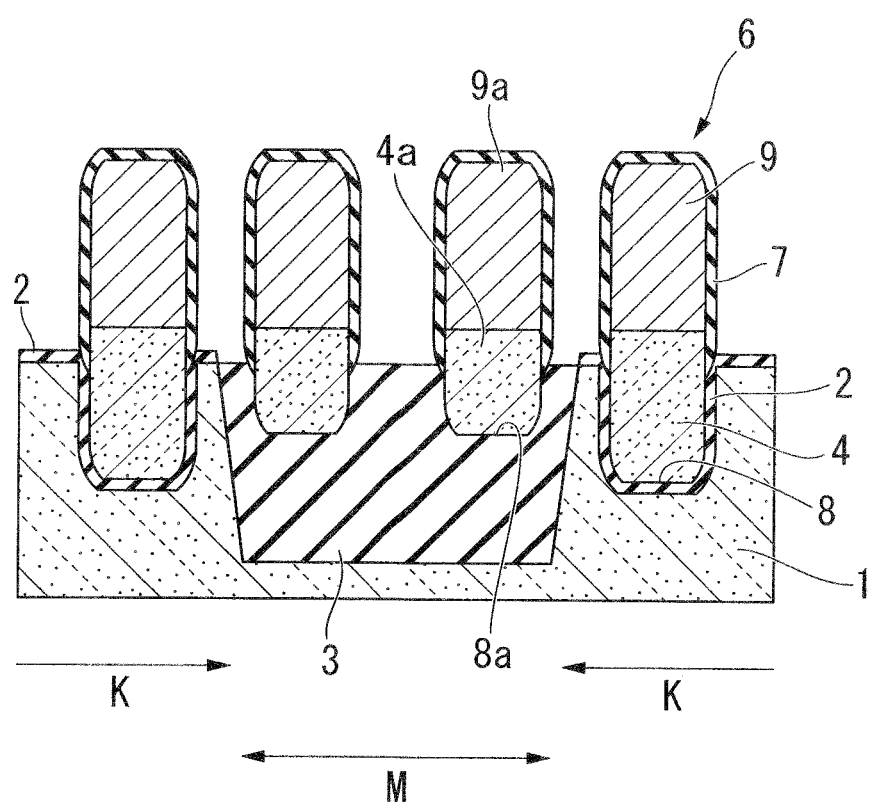
FIG. 1 is a cross-sectional view used for explaining an element separation process, a trench forming process, and a gate electrode forming process in a manufacturing method of a semiconductor device according to a first embodiment of the present invention.

As shown in FIG. 1, an STI element separation region (hereinafter, simply referred to as an element separation region) M is formed on the silicon substrate 1 in accordance with the STI (i.e. Shallow Trench Isolation) method. The element separation region M corresponds to an embedded insulating film 3 (composed of silicon oxide) which is formed in a recess of the silicon substrate 1 for the purpose of the element separation. Due to the formation of the element separation region M, it is possible to define active regions K (serving as islands) in the silicon substrate 1.

It is preferable that the embedded insulating film 3 be identical to a silicon oxide film (or a HDP-CVD film) which is formed via high-density plasma chemical vapor deposition (HDP-CVD), a silicon oxide film which is formed via SACVD (i.e. Sub-Atmospheric chemical vapor deposition) using a sub-atmosphere having a material gas such as ozone ($O_3$) and tetra-ethoxy-silane (TEOS), or a spin-on insulating (SOG) film composed of low dielectric material which is formed by spinning application. These films can be formed without oxidizing the silicon substrate 1, wherein it is possible to avoid the occurrence of numerous crystal defects in the silicon substrate 1 irrespective of stresses occurring due to volume variations by filling the element separation region M by thermal oxidation.

(b) Trench Forming Process

Next, a silicon nitride film is formed on the entire surface of the silicon substrate 1; then, openings are formed by selectively removing prescribed regions used for the formation of gate electrodes by photolithography and dry etching, thus forming a mask pattern (used for the formation of gate trenches, not shown). Dry etching is performed using the mask pattern so as to form trenches 8 traversing the active regions K with prescribed distances therebetween in the silicon substrate 1. At the same time, other trenches 8a whose depths are smaller than those of the trenches 8 are formed in the element separation region M. Thereafter, the silicon nitride film serving as the mask pattern is removed. Next, a silicon oxide film, i.e. a thermal oxide film 2 serving as a gate insulating film, is formed on the surface of the silicon substrate 1 and the interior surfaces of the trenches 8 by thermal oxidation.

(c) Gate Electrode Forming Process

Polysilicon layers 4 and metal layers 9 (both serving as wiring materials) are sequentially deposited and embedded in the trenches 8 so as to form gate electrodes 6. The polysilicon layers 4 and the metal layers 9 of the gate electrodes 6 are coated with silicon nitride films 7. In this connection, polysilicon layers 4a and metal layers 9a (both serving as wiring materials) are deposited and embedded in the trenches 8a which are formed in the embedded insulating film 3 corresponding to the element separation region M. Since the polysilicon layers 4a and the metal layers 9a which are formed in the element separation region M are subjected to patterning using the mask pattern which is used for the formation of the gate electrodes 6, they are formed in the same shapes as the polysilicon layers 4 and the metal layers 9 of the gate electrodes 6 so as to serve as gate wirings.

(d) Preprocessing

Figure 2:
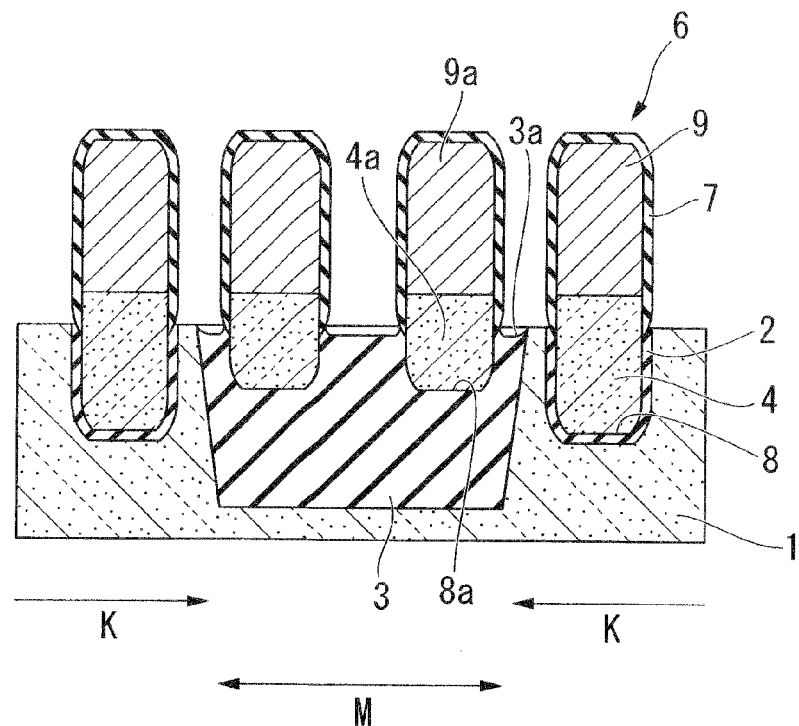
FIG. 2 is a cross-sectional view used for explaining a preprocessing in the manufacturing method of the semiconductor device according to the first embodiment of the present invention.

Prior to the selective epitaxial growth process, preprocessing is performed to remove the thermal oxide film 2 from both sides of the gate electrodes 6 in their width directions as shown in FIG. 2. In order to maintain high quality of crystallization in silicon single crystals subjected to epitaxial growth, in other words, in order to form silicon single crystals having no crystal defect, it is important to expose the "clean" surface of the silicon substrate 1 serving as seed crystals. For this reason, it is essential to remove thermal oxide films and natural oxide films from the surface of the silicon substrate 1 prior to epitaxial growth.

Conventionally-known preprocessing uses a solution of dilute hydrofluoric acid (DHF), whereas the present preprocessing does not use such a solution. In generally-known semiconductor manufacturing fields, dry etching is performed using a plasma gas, whereas the present invention does not use a plasma gas.

The details of the preprocessing will be described below.

The silicon substrate 1 of FIG. 1 is transported to and installed in a decompression closed chamber (not shown), which is temporarily set to a vacuum state and is then supplied with a mixed gas composed of ammonia ($NH_3$) and hydrofluoric anhydride (HF) with an equal flow rate at a pressure of 20 mTorr. This condition is maintained for sixty seconds such that the temperature of the silicon substrate 1 is set to 30° C. Silicon ammonium fluoride (($NH_4)_2SiF_6$) having 3 nm thickness is formed on the exposed surfaces of the thermal oxide film 2 and the embedded insulating film 3. This condition is maintained for sixty seconds, thereafter, the supply of the mixed gas composed of ammonia and hydrofluoric anhydride is stopped to the decompression closed chamber. Silicon ammonium fluoride is formed due to a reaction of ammonia, hydrofluoric anhydride, and silicon oxide. Due to the formation of silicon ammonium fluoride, it is possible to reduce the overall thickness of silicon oxide (corresponding to the thermal oxide film 2 and the embedded insulating film 3).

Next, the decompression closed chamber is set to the vacuum state again and is then supplied with an inert gas at a pressure of 650 mTorr such that the silicon substrate 1 is heated at a temperature of 180° C. Heating sublimates and removes silicon ammonium fluoride formed on the surfaces of the thermal oxide film 2 and the embedded insulating film 3. The above step should be repeated twice in order to sublimate and remove the thermal oxide film 2 of 6 nm thickness. Thus, the thermal oxide film 2 is sublimated and removed as silicon ammonium fluoride. After removal of the thermal oxide film 2, the silicon substrate 1 is transported to a selective epitaxial growth chamber (not shown) so as to achieve silicon growth.

The aforementioned conditions can be changed so as to appropriately control the processing times and the thickness of silicon ammonium fluoride, wherein the most important parameter is temperature control. The critical temperature causing reaction for forming silicon ammonium fluoride on the surface of silicon oxide may depend on pressure and is approximately set to 80° C. The heating temperature is preferably set to 50° C. or less for the purpose of the formation of silicon ammonium fluoride, while it is preferably set to 100° C. or more for the purpose of the sublimation of silicon ammonium fluoride.

The preprocessing has the following characteristics.
(1) Reaction for forming silicon ammonium fluoride occurs on the silicon oxide film only but does not occur on the silicon nitride film and silicon film.
(2) Silicon ammonium fluoride of a prescribed thickness can be formed on the silicon oxide film, which is formed by any type of method.

In the preprocessing, the embedded insulating film 3 of the element separation region M is etched so as to form recesses 3a on the surface of the embedded insulating film 3. An etching value applied to the embedded insulating film 3 is controlled to approximately match the thickness of the thermal oxide film 2. Even in the etching using the conventionally-known solution of DHF, it is possible to prevent the problem as described above in which the recesses 3a are divided and turned to communicate with the trenches 8a as a result of the etching rates of the embedded insulating film 3 and the thermal oxide film 2 in wet etching. This reliably prevents the polysilicon layers 4a coated with the silicon nitride films 7 from being exposed in the recesses 3a.

When the silicon substrate 1 is neglected for a long time after the preprocessing due to some trouble occurring in a selective epitaxial growth device (not shown), it is necessary to perform the preprocessing again in order to remove the natural oxide film. Even when the embedded insulating film 3 is further etched in another preprocessing, the first embodiment can prevent the exposure of the polysilicon layers 4 because it can control the etching value. For this reason, it is possible to prevent unwanted epitaxial growth via the polysilicon layers 4 in the next, selective epitaxial growth process.

(d) Epitaxial Growth Process

Figure 3:
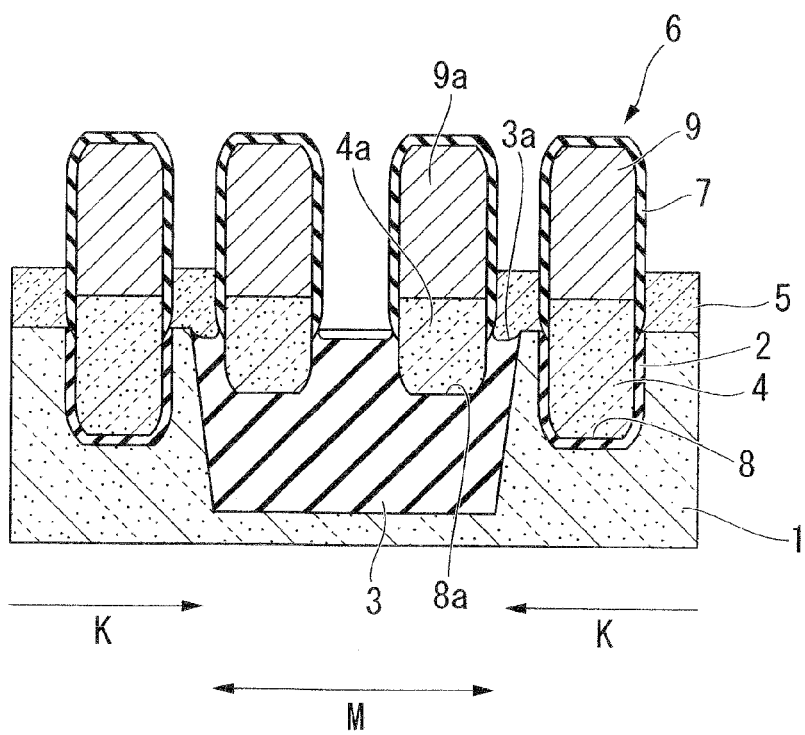
FIG. 3 is a cross-sectional view used for explaining an epitaxial growth process in the manufacturing method of the semiconductor device according to the first embodiment of the present invention.

As shown in FIG. 3, silicon epitaxial layers 5 are formed on both sides of the gate electrodes 6 in their width directions in the active regions K in accordance with selective epitaxial growth, wherein a mixed gas composed of dichloro-silane ($SiH_2Cl_2$) and hydrogen chloride (HCl) is supplied with a same flow rate to the chamber, which is heated at a temperature ranging from 700° C. to 900° C. Herein, epitaxial growth does not occur via the polysilicon layers 4a which are not exposed in the recesses 3a. Thus, it is possible to form the silicon epitaxial layers 5, which do not come in contact with the polysilicon layers 4a, on both sides of the gate electrodes 6 in width directions via the silicon nitride films 7 in the active regions K.

2. Second Embodiment

A second embodiment of the present invention will be described with reference to FIGS. 4 to 6.

The second embodiment is directed to preprocessing which is performed before the formation of contact plugs disposed in semiconductor devices.

Figure 4:
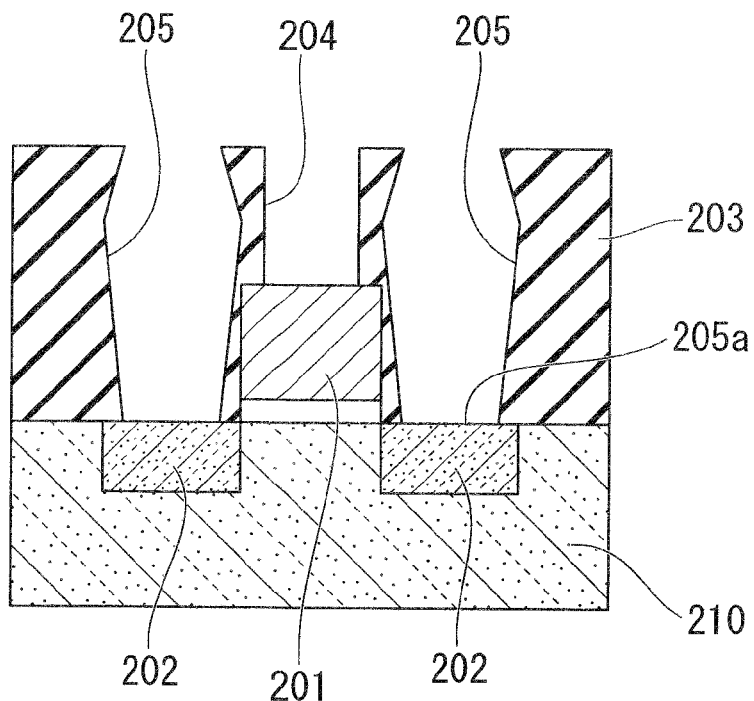
FIG. 4 is a cross-sectional view used for explaining a first step of a preprocessing in a manufacturing method of a semiconductor device according to a second embodiment of the present invention in which contact holes are formed on a silicon substrate.

FIG. 4 shows that contact holes are formed in a metal-oxide semiconductor (MOS) transistor formed on a silicon substrate 210, wherein source/drain regions 202 are formed on both sides of a gate electrode 201, and an interlayer insulating film 203 is formed on the entire surface via CVD. As the interlayer insulating film 203, it is possible to use an HDP-CVD film as well as other silicon oxide films, which are formed via low-pressure CVD causing thermal reaction between dichloro-silane or mono-silane ($SiH_4$) and dinitrogen monoxide ($N_2O$) at high temperature and low pressure conditions, via normal-pressure CVD causing reaction between mono-silane and oxygen at a low-temperature condition, via plasma CVD using an apparatus having parallel-plate electrodes, and via spinning application.

By use of photolithography and dry etching, a gate contact hole 204 is formed on the gate electrode 201, and contact holes 205 are formed on diffusion layers 202, thus forming the structure shown in FIG. 4.

Figure 5:
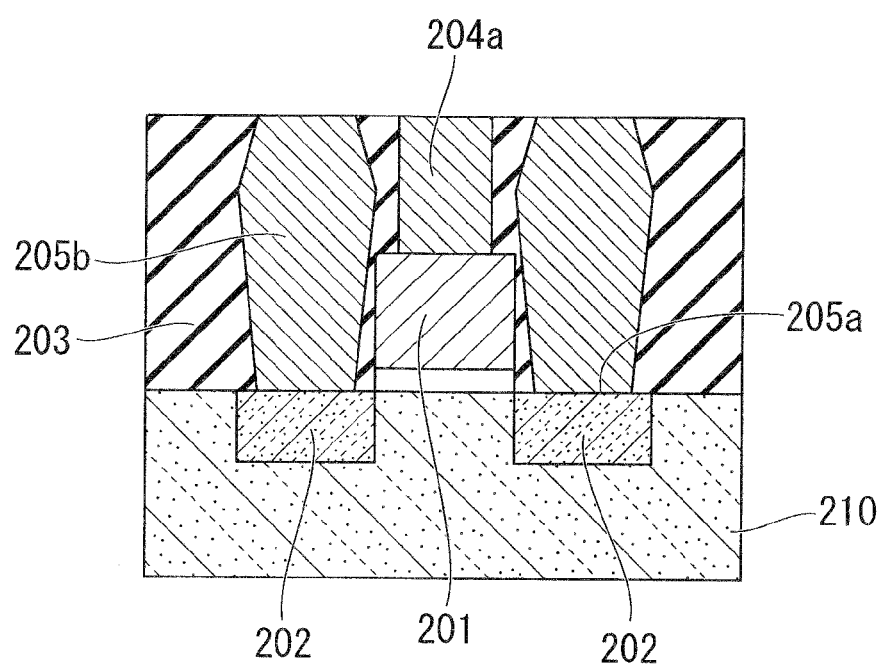
FIG. 5 is a cross-sectional view used for explaining a second step of the preprocessing in which contact plugs are formed using the contact holes on the silicon substrate.

Thereafter, as shown in FIG. 5, conductors are embedded in the contact holes 204 and 205, thus forming contact plugs 204a and 205b. When natural oxide films are formed on exposed portions 205a of the surface of the silicon substrate 210 in the bottoms of the contact holes 205, they likely disturb the operation of a semiconductor device. To solve this problem, it is essential to perform preprocessing before the formation of the contact plugs 204a and 205b.

It becomes difficult to use the conventionally-known etching solution of DHF with respect to contact holes having fine structures. When the preprocessing is performed using DHF, diameters of contact holes must be enlarged due to a high etching rate of the interlayer insulating film 203 formed via CVD. Contact holes have fine bored structures which increase the internal diameters thereof. When diameters of contact holes are increased in the preprocessing, the contact holes 204 and 205 may short-circuit each other, and the shoulders of the gate electrode 201 may be exposed, thus causing short-circuiting between the contact plugs 204a and 205b which are formed after the preprocessing.

In the preprocessing of the second embodiment for forming the contact plugs 204a and 205b in the contact holes 204 and 205 formed on the silicon substrate 210, similar to the preprocessing of the first embodiment, silicon ammonium fluoride is selectively formed using a mixed gas composed of ammonia and hydrofluoric anhydride and is then sublimated and removed via heating. It is preferable that the preprocessing be performed after the formation of the contact holes 204 and 205.

It is empirically presumed that the thickness of the natural oxide film naturally formed on the surface of the silicon substrate 210 may not exceed 1.5 nm. The preprocessing of the second embodiment makes it possible not to enlarge the diameters of the contact holes 204 and 205 beyond 3 nm;

hence, it is possible to prevent short-circuiting between constituent elements of the semiconductor device.

Figure 6:
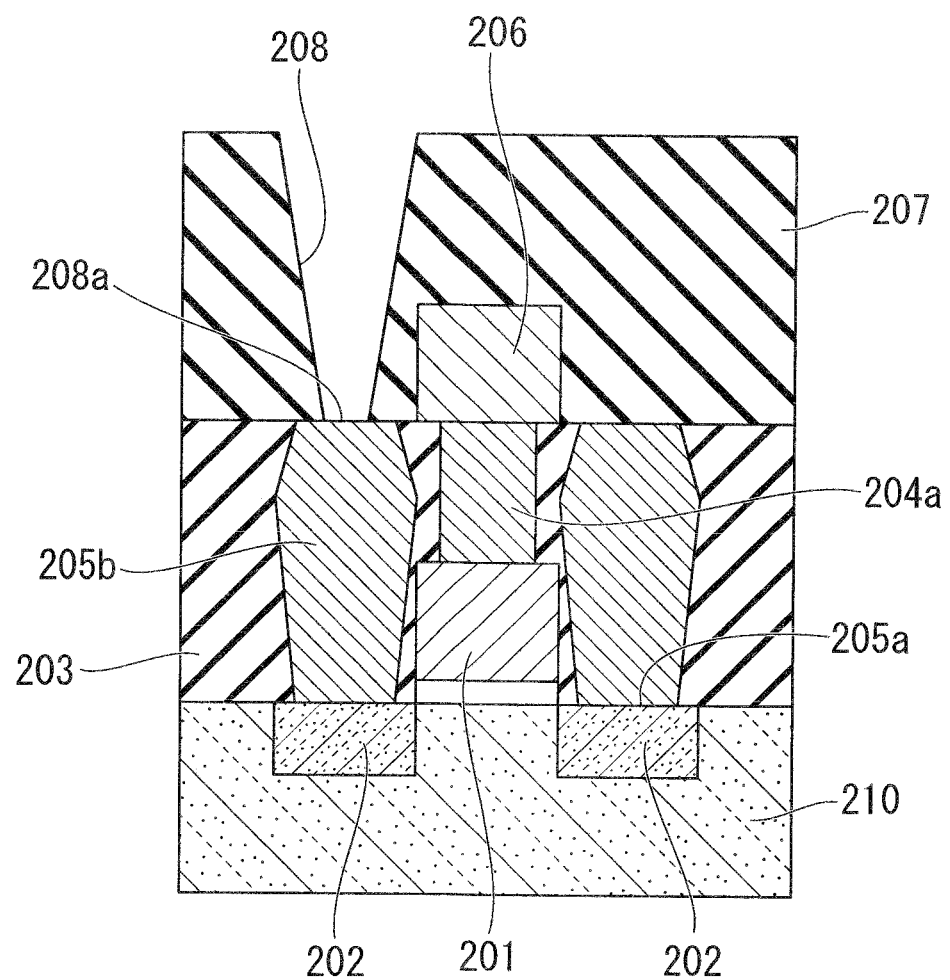
FIG. 6 is a cross-sectional view used for explaining a third step of the preprocessing in which another contact hole is formed on the contact plug on the silicon substrate.

FIG. 6 shows a further progression compared to FIG. 5, wherein after the formation of the contact plugs 204a and 205b composed of polysilicon, a wire 206 is formed in connection with the contact plug 204a; an interlayer insulating film 207 is formed above the wire 206; then, a contact plug 208 is formed to run through the prescribed portion of the interlayer insulating film 207 so as to communicate with the contact plug (or polysilicon plug) 205b, so that another contact plug will be formed in the contact hole 208 in the next process. When a natural oxide film is formed on an exposed surface 208a of the contact plug 205b which is exposed in the bottom of the contact hole 208, a contact resistance increases so as to likely disturb the operation of the semiconductor device. In order to prevent this problem, it is essential to perform preprocessing before the formation of the contact plug in the contact hole 208.

The structure of FIG. 6 also suffer from short-circuiting between the wire 206 and the contact hole (to be formed in the contact hole 208) when the diameter of the contact hole 208 is enlarged via etching using DHF.

In another preprocessing of the second embodiment in which the contact plug is formed in the contact hole 208 running through the interlayer insulating film 207, as similar to the preprocessing of the first embodiment, silicon ammonium fluoride is selectively formed using a mixed gas composed of ammonia and hydrofluoric anhydride on silicon oxide and is then sublimated and removed via heating. This makes it possible to remove the natural oxide film formed on the surface 208a of the contact plug 205b.

It is empirically presumed that the thickness of the natural oxide film formed on the surface 208a may not exceed 2 nm. The preprocessing of the second embodiment does not enlarge the diameter of the contact hole 208 beyond 4 nm; hence, it is possible to prevent short-circuiting between constituent elements of the semiconductor device.

Figure 7:
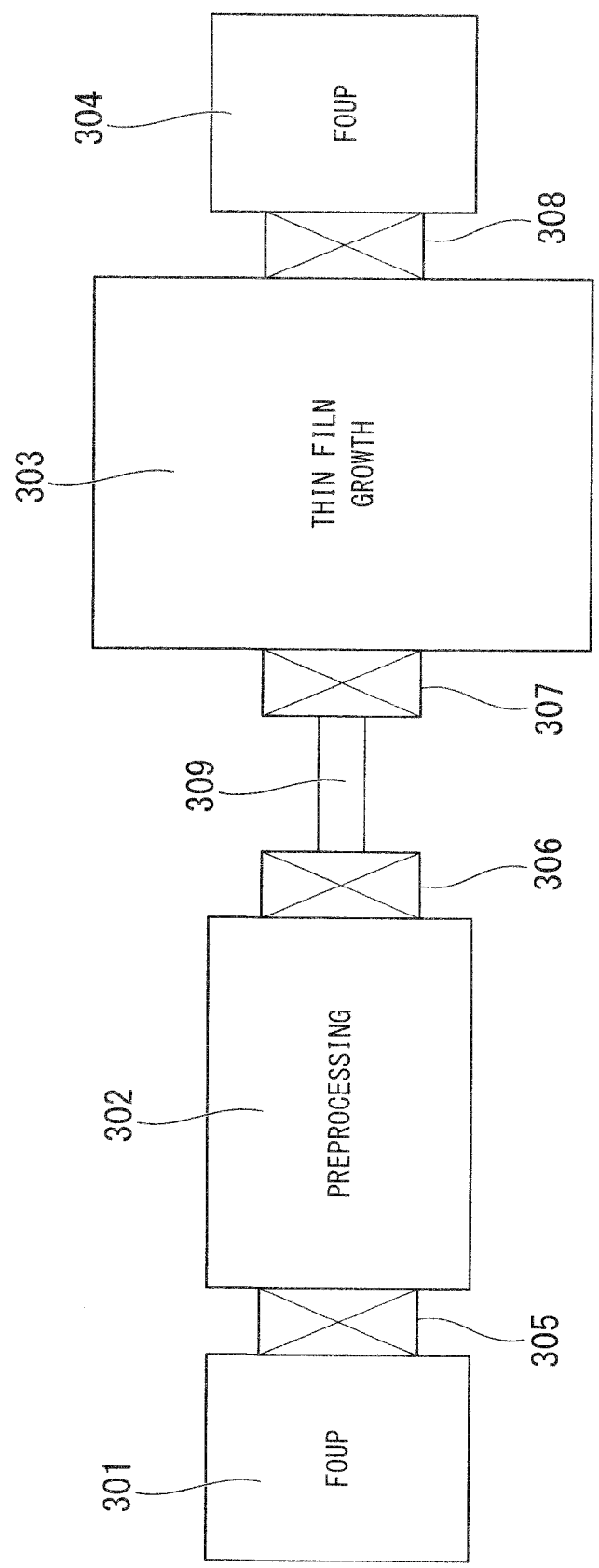
FIG. 7 is a block diagram showing the constitution of a semiconductor device manufacturing apparatus which is used to manufacture semiconductor devices in accordance with the present invention.
Figure 8:
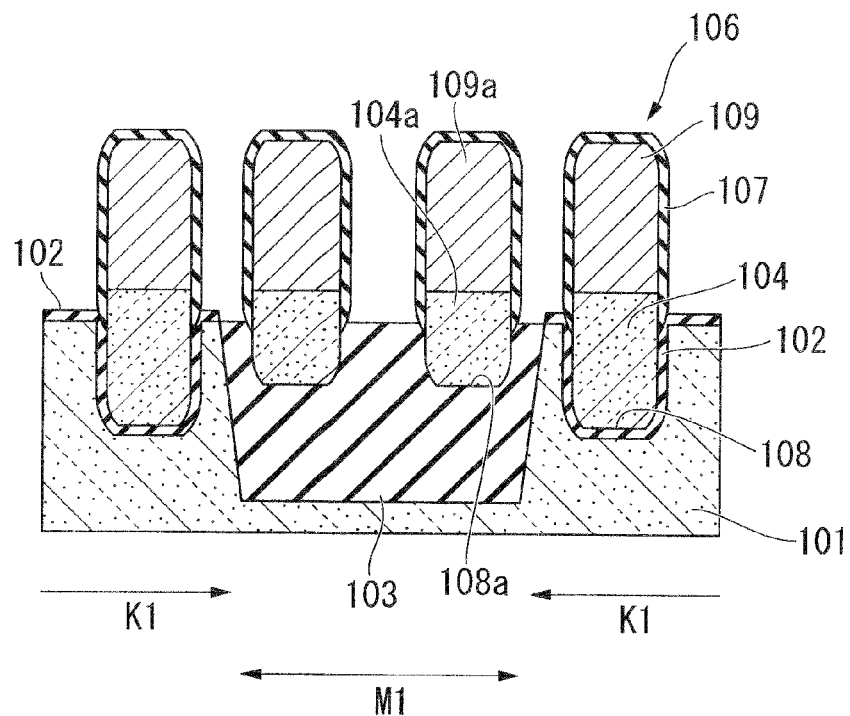
FIG. 8 is a cross-sectional view showing a part of a trench-gate structure applied to a semiconductor device.
Figure 9:
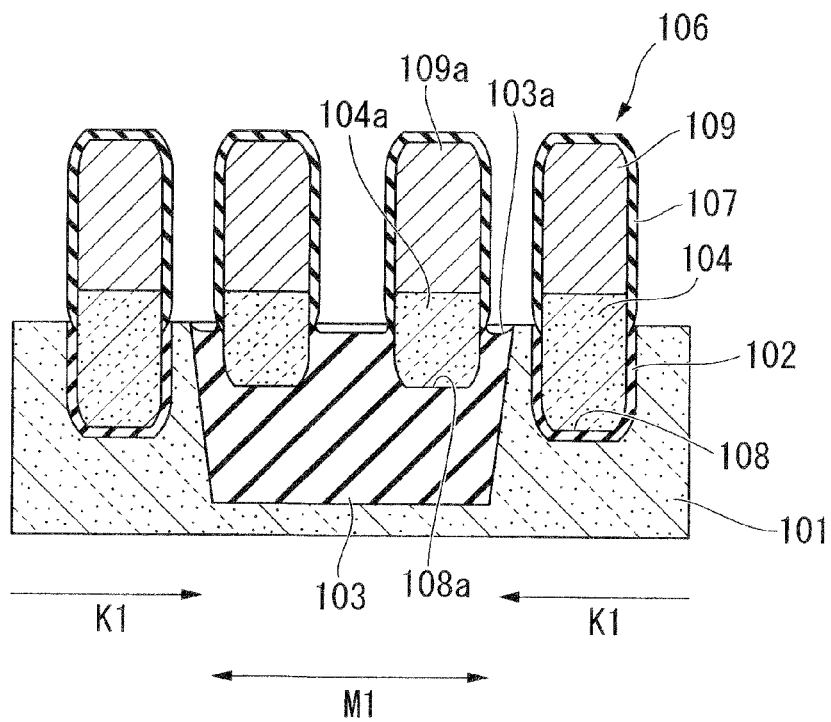
FIG. 9 is a cross-sectional view showing the semiconductor device of FIG. 8 subjected to wet etching as preprocessing.
Figure 10:
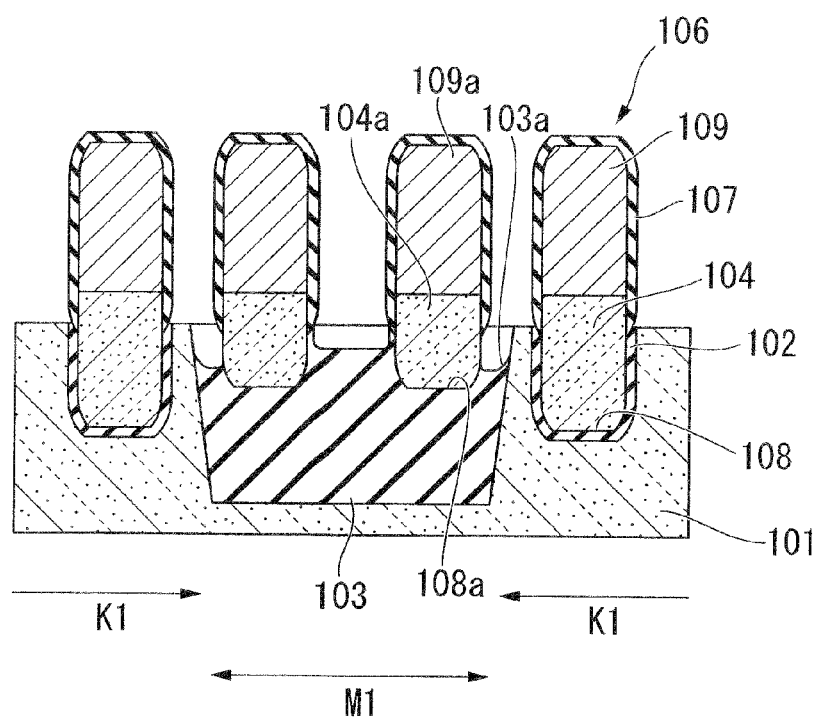
FIG. 10 is a cross-sectional view showing the semiconductor device of FIG. 8 which comes to have a recess due to long-time neglect after preprocessing.
Figure 11:
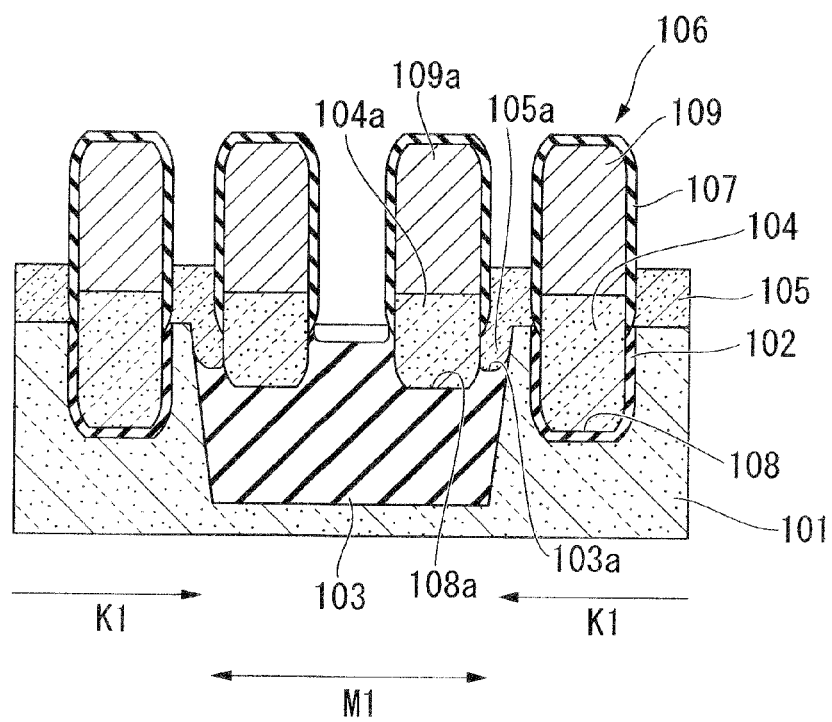
FIG. 11 is a cross-sectional view showing the semiconductor device of FIG. 10 subjected to selective epitaxial growth process.

FIG. 7 shows the constitution of a semiconductor device manufacturing apparatus which can be used to execute the first and second embodiments of the present invention. The semiconductor device manufacturing apparatus of FIG. 7 is constituted of blocks representative of an FOUP (i.e. Front Opening Unified Pod) 301, a preprocessing unit 302, a transport unit 309, a thin film growth unit 303, and an FOUP 304, which are separated from each other via gate valves 305, 306, 307, and 308. These blocks form one or plural systems so that they are pivotally controlled by a central processing unit (not shown).

First, a silicon substrate is transported from the FOUP 301 to the preprocessing unit 302, which has functions required to accomplish the aforementioned steps of the preprocessing in the first embodiment. Specifically, the preprocessing unit 302 has functions for carrying the silicon substrate in and out of a reaction chamber (not shown), functions for supplying at least nitrogen gas, hydrofluoric anhydride gas, and inert gas, functions for controlling the temperature of the silicon substrate, and functions for controlling the pressure of the reaction chamber.

The silicon substrate that has been already passed the preprocessing is transported to the thin film growth unit 303 by the transport unit 309. It is possible to provide a buffer chamber for keeping the silicon substrate intermediately in the transport unit 309. It is possible to allocate specific operations regarding epitaxial growth, polysilicon CVD, and conductor CVD (other than polysilicon CVD) to the thin film growth unit 303.

After completion of the thin film growth, the silicon substrate is stored in the FOUP 304. FIG. 7 shows that one preprocessing unit 302 is paired with one thin film growth unit 303; but it is possible to modify the system to have a multi-chamber structure in which plural thin film growth units suited to specific operations are collectively connected to one preprocessing unit 302.

The semiconductor device manufacturing apparatus of FIG. 7 is designed such that the preprocessing unit 302 and the thin film growth unit 303 are serially connected via the transport unit 309, which makes it possible to sequentially perform a series of the preprocessing and the thin film growth without exposing the silicon substrate to the atmosphere. It is very difficult for the conventionally-known apparatus performing preprocessing using DFH which suffers from a difficulty in handling an acid-contained solution to unify the preprocessing and the thin film growth, wherein the conventionally-known apparatus suffers from a problem in that, after exposure of the surface of the silicon substrate via preprocessing using DFH, a natural oxide film is likely formed on the surface of the silicon substrate before the silicon substrate is transported to an external thin film growth apparatus. In contrast, the preprocessing of the present invention does not use any solution, which makes it possible to unify the preprocessing unit with the thin film growth unit. Thus, the present invention is advantageous in that epitaxial-growth silicon having high-crystalline property and silicon plugs having small contact resistances can be formed by inhibiting the growth of natural oxide films.

3. Third Embodiment

A manufacturing method of a semiconductor device according to a third embodiment of the present invention will be described with reference to FIGS. 12 and 13, which are used to explain a preprocessing in a crown capacitor fabrication process.

Figure 12:
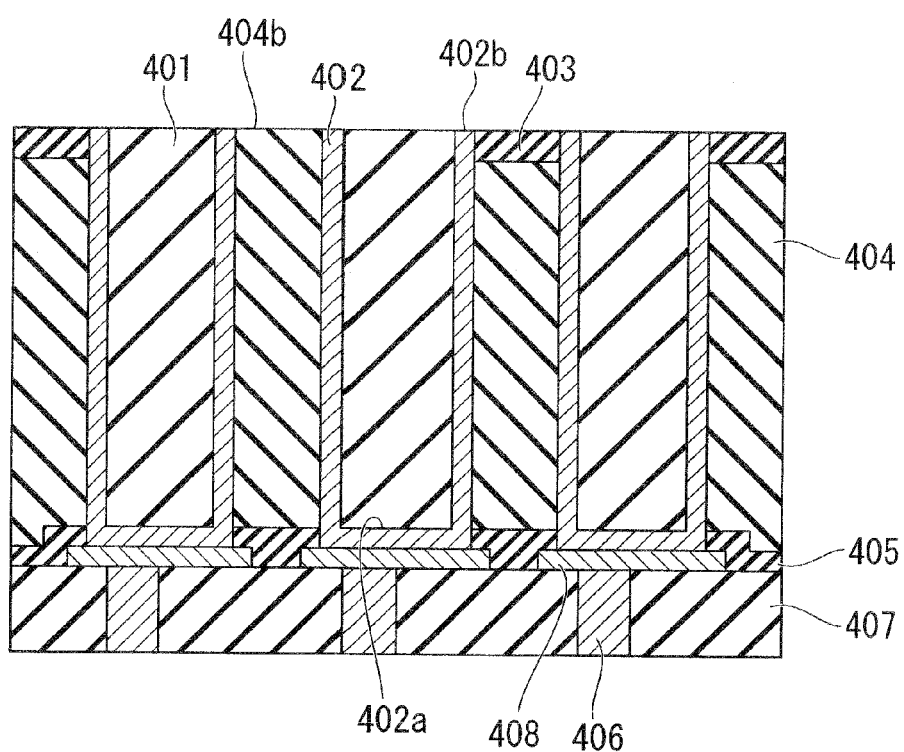
FIG. 12 is a cross-sectional view used for explaining a manufacturing method of a semiconductor device according to a third embodiment of the present invention.

In FIG. 12, metal plugs 406 connected with wires 408 are embedded in a first interlayer insulating film 407, the surface of which is covered with an etching stopper layer 405 composed of nitrogen. A second interlayer insulating film 404 is formed on the surface of the first interlayer insulating film 407.

Recesses are formed in the second interlayer insulating film 404; then, lower electrodes 402 having cylindrical shapes are formed to coat the interior surfaces and the bottoms of the recess, wherein bottoms 402a thereof are brought into contact with the wires 408.

By way of photolithography, a bridged nitride film 403 having a prescribed pattern is formed on the surface of the second interlayer insulating film 404 in connection with the lower electrodes 402. The bridged nitride film 403 is used to prevent the lower electrodes 402 from falling off after removal of the second interlayer insulating film 404. Exposed surfaces 404b of the second insulating film 404 are exposed in the prescribed portions having no bridged nitride film 403 between the lower electrodes 402.

Next, a sacrifice oxide film 401 is formed to fill the insides of the cylindrical lower electrodes 402 and to cover the bridged nitride film 403.

Lastly, chemical mechanical polishing (CMP) is performed to remove the sacrifice oxide film 401 and the opening areas of the lower electrodes 402, thus exposing the bridged nitride film 403. Thus, it is possible to completely produce the structure of FIG. 12.

Figure 13:
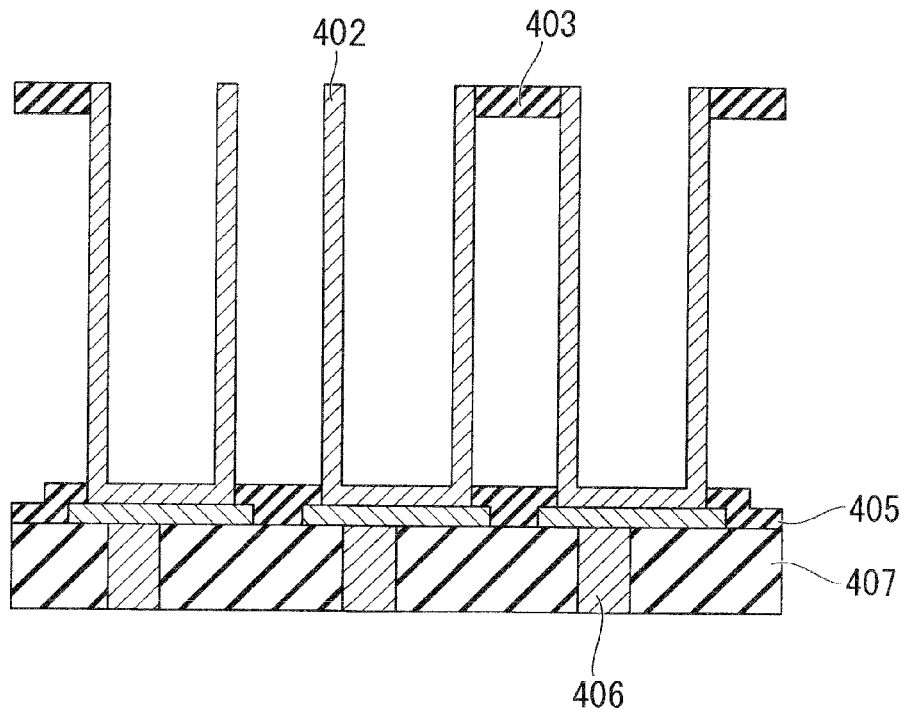
FIG. 13 is a cross-sectional view used for explaining a preprocessing in a crown capacitor fabrication process executed on the structure shown in FIG. 12.

Next, the preprocessing of the crown capacitor fabrication process is performed so as to remove the sacrifice oxide film 401 and the second interlayer insulating film 404 as shown in FIG. 13.

Dry etching is preferably adapted to the preprocessing. This is because the etching selection ratio (regarding oxide and nitride films) of dry etching becomes higher than that of wet etching, so that the etching value of the nitride film in dry etching can be decreased to one-third of the etching value in wet etching. That is, it is possible to reliably remove the sacrifice oxide film 401 and the second interlayer insulating film 404 while controlling etching of the bridged nitride film 403. In addition, it is possible to reduce the thickness of the bridged nitride film 403, thus preventing defects such as defocus due to stress.

When wet etching is adapted to the preprocessing, the bridged nitride film 403 must be etched during the removal of the sacrifice oxide film 401 and the second interlayer insulating film 404. In case of wet etching, it is necessary to increase the thickness of the bridged nitride film 403, which in turn causes defects such as defocus due to the stress of the bridged nitride film 403.

As dry etching, it is possible to use chemical etching using $NH_3+HF$, in which a decompression closed chamber is evacuated using a depression pump and is then supplied with gases such as HF, $NH_3$, and NFx. The decompression closed chamber is subject to the process temperature ranging from room temperature to 80° C. during etching and then it is subject to the process temperature ranging from 80° C. to 500° C. during sublimation of reactive compounds.

In this connection, it is possible to perform dry etching after the formation of the lower electrodes 402 and before the formation of the sacrifice oxide film 401 filled inside the lower electrodes 402. Alternatively, dry etching can be performed after the lower electrodes 402 are coated with a resist via photolithography.

4. Fourth Embodiment

A fourth embodiment of the present invention will be described with reference to FIGS. 14 to 22, which are used to explain a preprocessing in a trench gate fabrication process.

Figure 14:
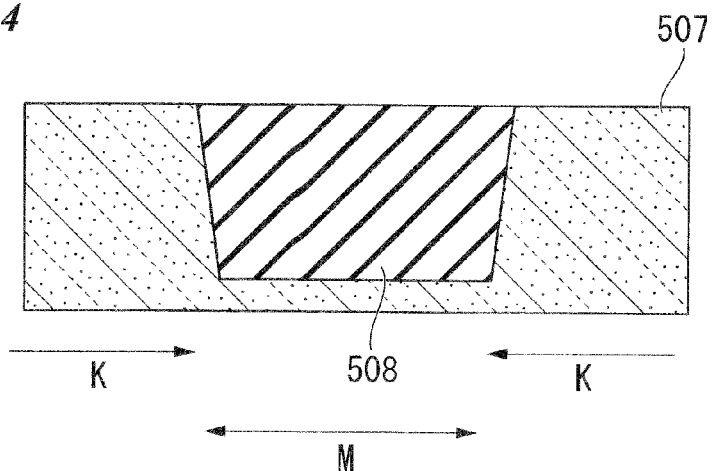
FIG. 14 is a cross-sectional view used for explaining a first step of a manufacturing method of a semiconductor device according to a fourth embodiment of the present invention.

As shown in FIG. 14, an STI element separation region (hereinafter, simply referred to as an element separation region) M is formed in a silicon substrate 507 via STI. The element separation region M is formed by way of the formation of an embedded insulating film 508 composed of a silicon oxide film in a recess of the silicon substrate 507. Due to the formation of the element separation region M, active regions K are formed as islands in the silicon substrate 507.

It is preferable that the embedded insulating film 508 be identical to a silicon oxide film (or an HDP-CVD film) which is formed using an induction plasma apparatus via high-density plasma CVD (HDP-CVD), a silicon oxide film which is formed using material gases composed of ozone ($O_3$) and tetra-ethoxy-silane (TEOS) in a sub-atmospheric condition via SACVD, or an insulating film (or an SOG film) composed of a low-dielectric material which is formed via spinning application. These films can be formed without causing oxidation on the silicon substrate 507, wherein they have high etching rates in wet etching so as to improve embedding properties. Thus, it is possible to prevent numerous crystal defects from occurring in the silicon substrate 507 due to volume variations caused by filling the element separation region M via thermal oxidation.

(a) Trench Forming Process

Figure 15:
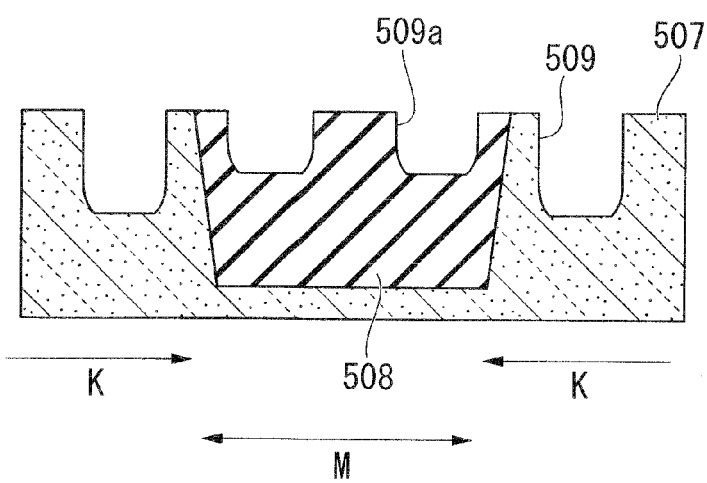
FIG. 15 is a cross-sectional view used for explaining a second step of the manufacturing method in relation to a trench forming process.

Similarly to the trench forming process of the first embodiment, a silicon nitride film is formed on the entire surface of the silicon substrate 507, then prescribed areas used for forming gate electrodes are selectively removed via photolithography and dry etching so as to form openings, thus forming a mask pattern (used for forming gate trenches, not shown). Dry etching is performed using the mask pattern so as to form trenches 509 traversing the active regions K with prescribed distances therebetween on the silicon substrate 507. At the same time, other trenches 509a are formed in the element separation region M. The depths of the trenches 509a are smaller than the depths of the trenches 509. Thereafter, the silicon nitride film serving as the mask pattern is removed from the silicon substrate 507. Thus, it is possible to form the trenches 509 in the silicon substrate 507 while forming the trenches 509a in the embedded insulating film 508 as shown in FIG. 15.

Figure 16:
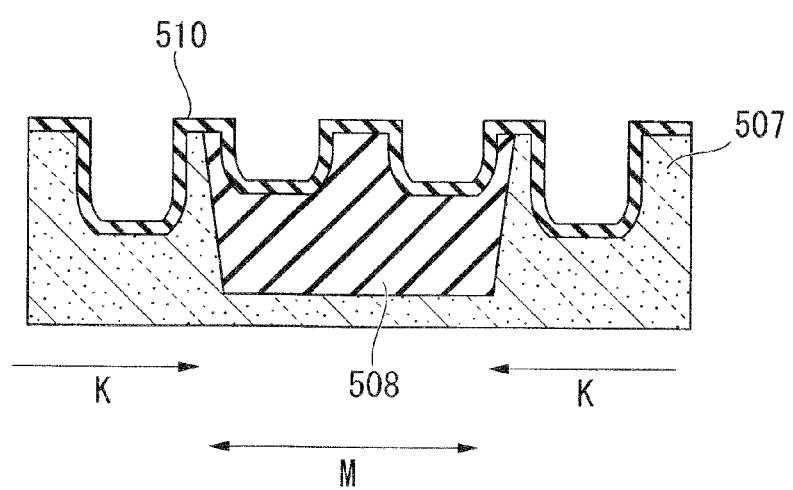
FIG. 16 is a cross-sectional view used for explaining a third step of the manufacturing method in relation to the trench forming process.

As shown in FIG. 16 thermal oxidation is performed to form a thermal oxide film 510 composed of silicon oxide on the surface of the silicon substrate 507 and on the interior surfaces of the trenches 509 and 509a. The thermal oxide film 510 serves as a gate insulating film.

(b) Preprocessing

Figure 17:
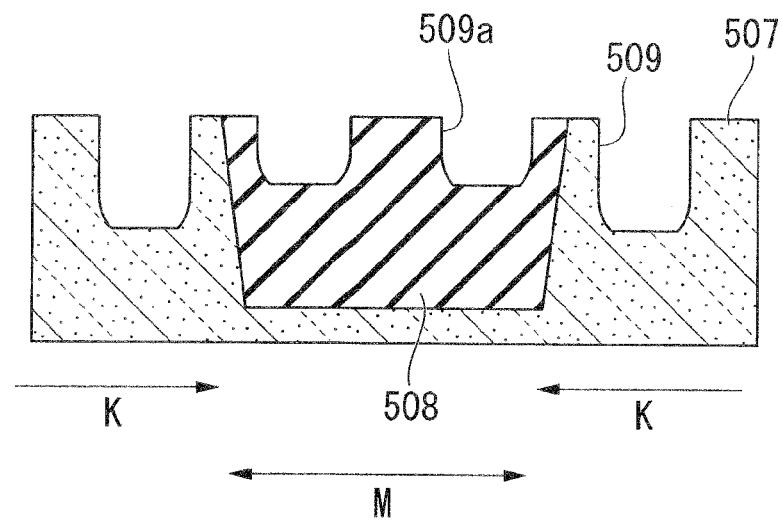
FIG. 17 is a cross-sectional view used for explaining a fourth step of the manufacturing method in relation to a preprocessing adopting dry etching.

Similarly to the preprocessing of the third embodiment, preprocessing is performed via dry etching in the fourth embodiment. FIG. 17 is a cross-sectional view showing the structure already subjected to the preprocessing.

Due to the preprocessing, the thermal oxide film 510 and its natural oxide film are etched and removed from the interior surfaces of the trenches 509 and 509a, which are thus cleaned.

Since the preprocessing using the dry etching is capable of controlling an etching value applied to the embedded insulating film 508 composed of the SOD film, it is possible to maintain the sizes of the trenches 509a (formed on the embedded insulating film 508) substantially in correspondence with the sizes of the trenches 509 (formed on the surface of the silicon substrate 507).

(c) Gate Electrode Forming Process

Figure 18:
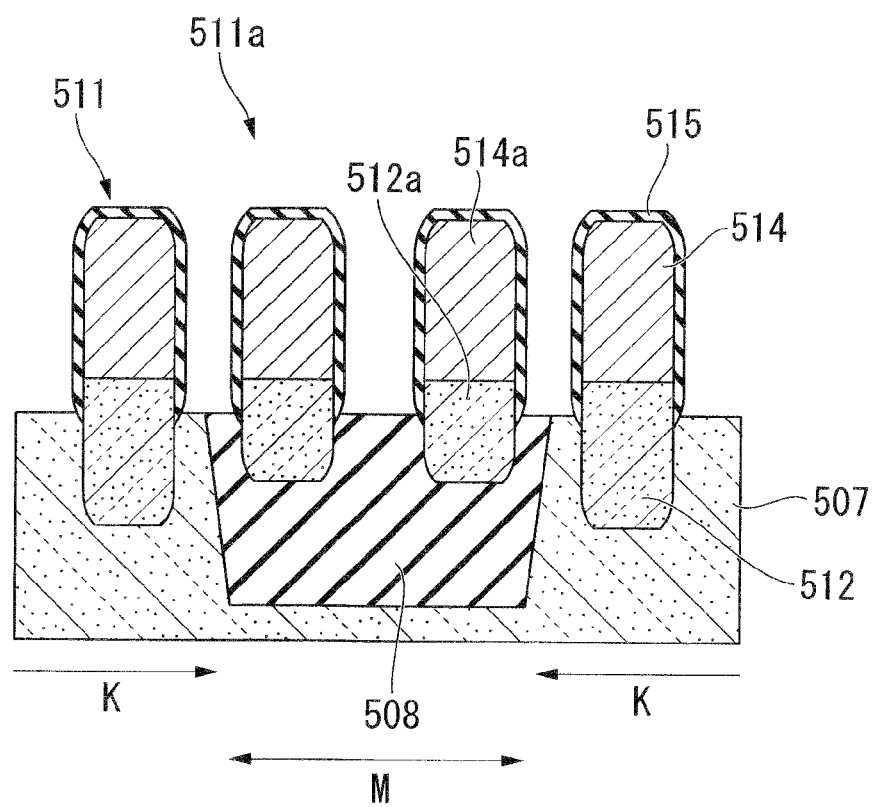
FIG. 18 is a cross-sectional view used for explaining a fifth step of the manufacturing method in relation to a gate electrode forming process.

As shown in FIG. 18, polysilicon layers 512 and 512a (composed of wiring materials) are formed and filled inside the trenches 509 and 509a; metal layers 514 and 514a (composed of wiring materials) are sequentially formed on the polysilicon layers 512 and 512a; then, silicon nitride films 515 are formed to coat the exposed surfaces of the polysilicon layers 512 and 512a and the exposed surfaces of the metal layers 514 and 514a, thus forming gate electrodes 511 and 511a.

FIG. 18 shows that both the gate electrodes 511 and 511a have similar shapes, wherein the gate electrodes 511a serve as gate wires.

Prior to the formation of the polysilicon layers 512 and 512a, the thermal oxide film 510 and its natural oxide film are removed from the interior surfaces of the trenches 509 and 509a, which are thus cleaned. This makes it possible to form the polysilicon layers 512 and 512a having high quality.

Since the sizes of the trenches 509a of the embedded insulating film 508 are identical to the sizes of the trenches 509 of the silicon substrate 507, it is possible to secure prescribed distances between the polysilicon layers 512a and the silicon substrate 507.

(d) Epitaxial Growth Process

Figure 19:
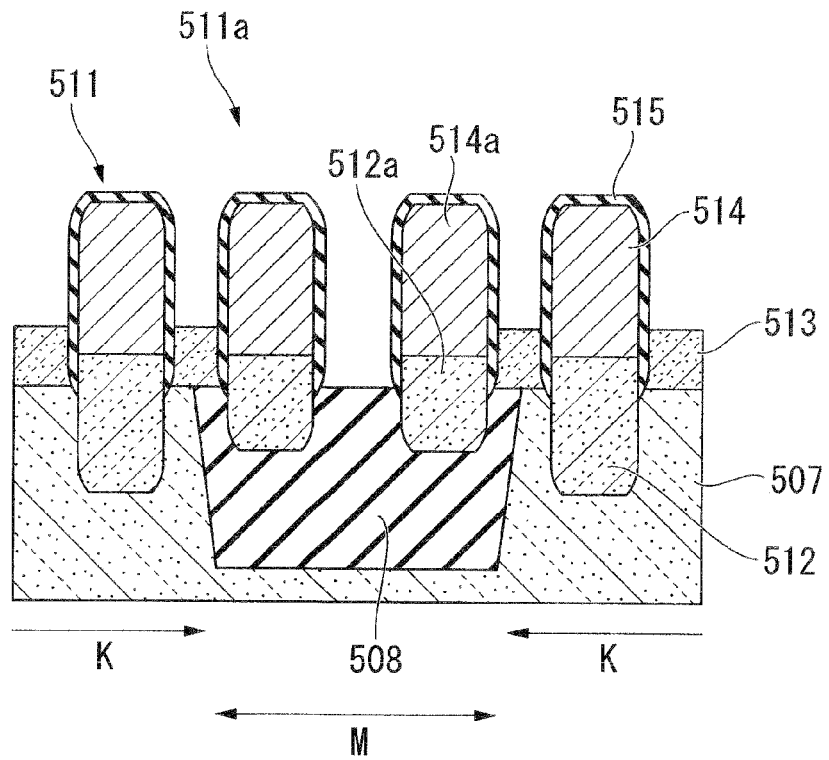
FIG. 19 is a cross-sectional view used for explaining a sixth step of the manufacturing method in relation to an epitaxial growth process.

As shown in FIG. 19, silicon epitaxial layers 513 are formed on both sides of the gate electrodes 511 in their width directions in the active regions K via selective epitaxial growth. Selective epitaxial growth is executed by supplying dichloro-silane (SiH2CL2) gas and hydrogen chloride (HCH) gas with the same flow rate to the chamber at the prescribed temperature ranging from 700° C. to 900° C. At this time, epitaxial growth does not occur via the polysilicon layers 512a which are not exposed. Thus, it is possible to form the silicon epitaxial layers 513 which are not brought into contact with the polysilicon layers 512a and which are precisely formed on both sides of the gate electrodes 511 in width directions in the active regions K via the silicon nitride films 515.

The above fabrication does not substantially cause short-circuiting between the gate electrodes 511 and the silicon epitaxial layers 513.

It is possible to adopt wet etching instead of dry etching in the preprocessing, however, wet etching causes the following problem, which will be described with reference to FIGS. 20 to 22.

The embedded insulating film 508 is composed of the SOD film having a high etching rate in wet etching on the silicon substrate 507. After the thermal oxide film 510 is removed via wet etching, the exposed portion of the embedded insulating film 508 is etched at a high speed via wet etching compared to dry etching. In the SOD film, a ratio between the wet etching value and the dry etching value is 3:1, for example.

Figure 20:
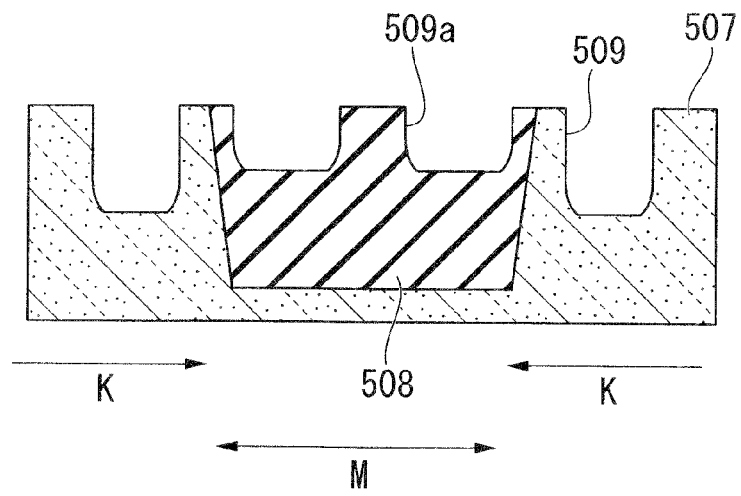
FIG. 20 is a cross-sectional view used for explaining the preprocessing adopting wet etching in the manufacturing method.

Due to excessive etching of the SOD film, the etched widths of the trenches 509a formed on the embedded insulating film 508 become larger that the etched widths of the trenches 509 formed on the silicon substrate 507 as shown in FIG. 20.

Figure 21:
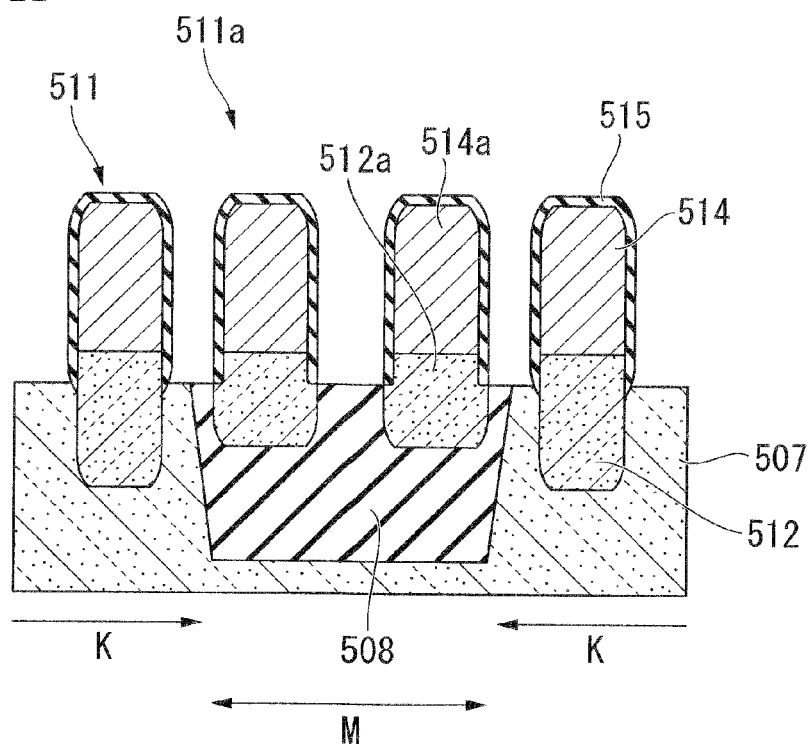
FIG. 21 is a cross-sectional view used for explaining the gate electrode forming process executed subsequently to the wet etching shown in FIG. 20.

In the gate electrode forming process executed subsequently to the preprocessing adopting the wet etching, the polysilicon films 512a formed in the trenches 509a are enlarged in widths so as to reduce the distances between the polysilicon layers 512a and the silicon substrate 507 as shown in FIG. 21.

Figure 22:
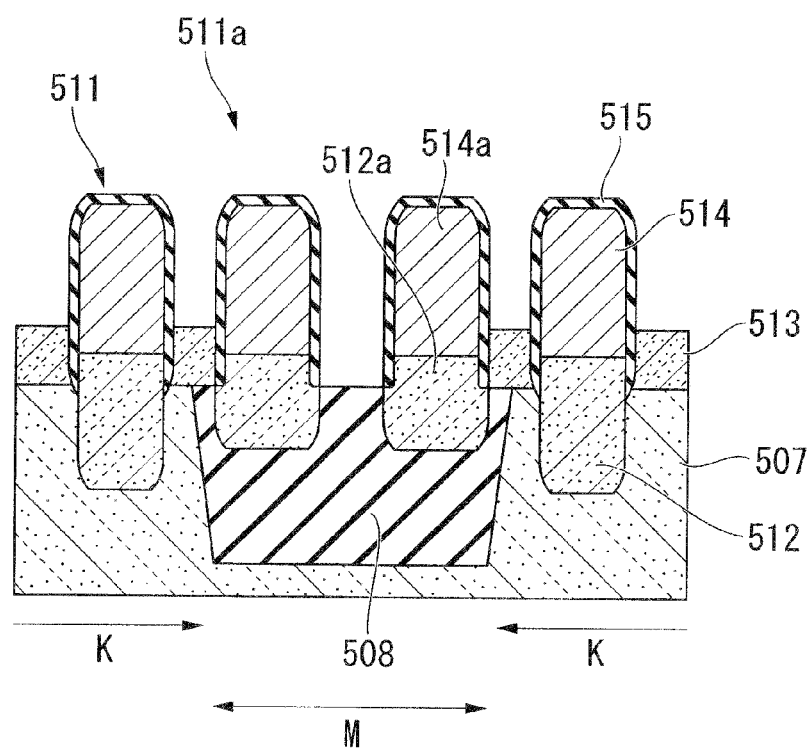
FIG. 22 is a cross-sectional view used for explaining the epitaxial growth process executed subsequently to the gate electrode forming process shown in FIG. 21.

Lastly, the epitaxial growth process is executed subsequently to the gate electrode forming process so that, as shown in FIG. 22, the silicon epitaxial layers 513 are partially brought into contact with the polysilicon layers 512a, thus likely causing short-circuiting between the gate electrodes 511a and the silicon epitaxial layers 513.

5. INDUSTRIAL APPLICABILITY

The present invention is advantageous in comparison with the conventionally-known semiconductor device manufacturing method in particular in terms of the preprocessing executed subsequently to the selective epitaxial growth process.

Finally, it is apparent that the present invention is not limited to the above embodiments, but may be modified and changed without departing from the scope and spirit of the invention.

What is claimed is:

1. A manufacturing method of a semiconductor device, comprising:

forming a contact hole in an interlayer insulating film over a semiconductor substrate, to expose a surface of the semiconductor substrate, whereby a natural oxide film is formed on the exposed surface of the semiconductor substrate;

placing the semiconductor substrate on which the natural oxide film is formed, in a mixed gas including ammonia and HF at a temperature of less than 50° C., to form a silicon ammonium fluoride on the surface of the semiconductor substrate by reacting the natural oxide film with the ammonia and the HF;

placing the semiconductor substrate on which the silicon ammonium fluoride is formed in an inert gas at a temperature higher than 100° C., to remove the silicon ammonium fluoride on the surface of the semiconductor substrate, resulting in removing the natural oxide film on the surface of the semiconductor substrate; and embedding a conductor in the contact hole to form a contact plug after removing the natural oxide film on the surface of the semiconductor substrate.

2. The method as claimed in claim 1, further comprising:

forming at least one of source and drain regions on the semiconductor substrate; and wherein the contact hole is formed to expose the one of source and drain regions.

3. The method as claimed in claim 2, further comprising:

forming a gate electrode over the semiconductor substrate;

forming a second contact hole in the interlayer insulating film to expose a surface of the gate electrode; and forming a second contact plug in the second contact hole.

4. The method as claimed in claim 3, further comprising:

forming a second interlayer insulating film on the first interlayer insulating film after forming the first and second contact plugs;

forming a third contact hole in the second interlayer insulating film to expose a surface of the second contact plug, whereby another natural oxide film is formed on the exposed surface of the second contact plug;

placing the semiconductor substrate on which the third contact hole is formed, in the mixed gas including ammonia and HF at a temperature less than 50° C., to form the silicon ammonium fluoride on the surface of the second contact plug by reacting the another natural oxide film on the second contact plug with the ammonia and the HF; and placing the semiconductor substrate on which the silicon ammonium fluoride is formed on the second contact plug in an inert gas at a temperature higher than 100° C., to remove the silicon ammonium fluoride on the surface of the second contact plug, resulting in removing the another natural oxide film on the second contact plug.

5. The method as claimed in claim 4, wherein the silicon ammonium fluoride is removed by sublimating the silicon ammonium fluoride.

6. The method as claimed in claim 1, wherein the HF of the mixed gas is hydrofluoric anhydride.

7. The method as claimed in claim 4, wherein the HF of the mixed gas is hydrofluoric anhydride.

* * * * *